United States Patent
Oh et al.

(10) Patent No.: US 9,342,095 B2
(45) Date of Patent: May 17, 2016

(54) TIMING CALIBRATION FOR MULTIMODE I/O SYSTEMS

(75) Inventors: Kyung Suk Oh, Cupertino, CA (US); Akash Bansal, Santa Clara, CA (US)

(73) Assignee: Rambus Inc., Sunnyvale, CA (US)

( * ) Notice: Subject to any disclaimer, the term of this patent is extended or adjusted under 35 U.S.C. 154(b) by 294 days.

(21) Appl. No.: 14/001,398

(22) PCT Filed: Feb. 24, 2012

(86) PCT No.: PCT/US2012/026583
§ 371 (c)(1), (2), (4) Date: Aug. 23, 2013

(87) PCT Pub. No.: WO2012/118714
PCT Pub. Date: Sep. 7, 2012

(65) Prior Publication Data
US 2014/0019792 A1     Jan. 16, 2014

Related U.S. Application Data

(60) Provisional application No. 61/448,591, filed on Mar. 2, 2011.

(51) Int. Cl.
*G06F 1/08* (2006.01)
*G06F 13/16* (2006.01)
(Continued)

(52) U.S. Cl.
CPC .............. *G06F 1/08* (2013.01); *G06F 13/1689* (2013.01); *G11C 7/1066* (2013.01);
(Continued)

(58) Field of Classification Search
CPC ............ H04L 12/2417; H04L 12/2418; H04L 12/2464; H04L 47/10; H04L 1/0002; H04L 47/263; H04L 5/1446; H04L 1/006; H04L 1/0013; H04W 52/26
USPC .......................................... 375/225, 260, 295
See application file for complete search history.

(56) References Cited

U.S. PATENT DOCUMENTS

| | | | | |
|---|---|---|---|---|
| 5,260,700 A | * | 11/1993 | Merchant | ............... H04H 20/67 340/313 |
| 5,627,798 A | * | 5/1997 | Siems et al. | ..................... 367/76 |

(Continued)

FOREIGN PATENT DOCUMENTS

| | | |
|---|---|---|
| JP | 2002-215560 A | 8/2002 |
| JP | 2008-269467 A | 11/2008 |

OTHER PUBLICATIONS

PCT International Search Report and Written Opinion, PCT/US2012/026583, Dec. 18, 2012, 10 Pages.
(Continued)

*Primary Examiner* — Emmanuel Bayard
(74) *Attorney, Agent, or Firm* — Fenwick & West LLP

(57) ABSTRACT

Integrated circuit devices that operate in different modes. In a low data rate mode, data is transferred between the integrated circuit devices at a low data rate, or no data is transferred at all. In a high data rate mode, data is transferred between integrated circuit devices at a high data rate. A transition mode facilitates the transition from the low data rate mode to the high data rate mode. During the transition mode data is transferred between the integrated circuit devices at an intermediate data rate greater than the low data rate but lower than the high data rate. Also during the transition mode, parameters affecting the transmission of data between the integrated circuit devices are calibrated at the high data rate.

20 Claims, 5 Drawing Sheets

(51) Int. Cl.
*G11C 7/10* (2006.01)
*G11C 29/02* (2006.01)

(52) U.S. Cl.
CPC .......... *G11C 7/1093* (2013.01); *G11C 29/022* (2013.01); *G11C 29/023* (2013.01); *G11C 29/028* (2013.01); *G11C 2207/2254* (2013.01)

(56) References Cited

U.S. PATENT DOCUMENTS

| | | | |
|---|---|---|---|
| 6,424,636 B1 * | 7/2002 | Seazholtz | H04M 11/062 370/295 |
| 6,487,620 B1 * | 11/2002 | Grosshog | G06F 13/4291 710/105 |
| 6,501,734 B1 * | 12/2002 | Yu et al. | 370/236 |
| 6,675,272 B2 | 1/2004 | Ware et al. | |
| 6,735,709 B1 | 5/2004 | Lee et al. | |
| 7,177,998 B2 | 2/2007 | Ware et al. | |
| 7,200,055 B2 | 4/2007 | Ware et al. | |
| 7,209,397 B2 | 4/2007 | Ware et al. | |
| 7,210,016 B2 | 4/2007 | Ware et al. | |
| 7,225,292 B2 | 5/2007 | Ware et al. | |
| 7,225,311 B2 | 5/2007 | Ware et al. | |
| 7,298,703 B1 * | 11/2007 | Rose | 370/236 |
| 7,484,064 B2 | 1/2009 | Ware et al. | |
| 7,535,879 B2 * | 5/2009 | Morioka et al. | 370/338 |
| 7,542,453 B2 * | 6/2009 | Morioka et al. | 370/338 |
| 7,752,476 B2 * | 7/2010 | Macri et al. | 713/400 |
| 7,782,891 B2 * | 8/2010 | Kadambi et al. | 370/438 |
| 8,214,616 B2 | 7/2012 | Ware et al. | |
| 8,320,202 B2 | 11/2012 | Ware et al. | |
| 8,450,978 B2 * | 5/2013 | Barsukov et al. | 320/136 |
| 8,538,624 B2 * | 9/2013 | Lindinger | G07B 15/063 701/32.5 |
| 8,638,851 B2 * | 1/2014 | Jeong et al. | 375/240.1 |
| 8,817,695 B1 * | 8/2014 | Rai | H04W 52/48 370/235 |
| 8,861,541 B1 * | 10/2014 | Banerjea | H04L 47/122 370/431 |
| 8,934,515 B2 * | 1/2015 | Deltour | H04B 1/7156 375/132 |
| 2002/0174311 A1 | 11/2002 | Ware et al. | |
| 2004/0054845 A1 | 3/2004 | Ware et al. | |
| 2004/0170072 A1 | 9/2004 | Ware et al. | |
| 2005/0169097 A1 | 8/2005 | Ware et al. | |
| 2006/0007761 A1 | 1/2006 | Ware et al. | |
| 2006/0039174 A1 | 2/2006 | Ware et al. | |
| 2006/0069895 A1 | 3/2006 | Ware et al. | |
| 2006/0077731 A1 | 4/2006 | Ware et al. | |
| 2006/0129776 A1 | 6/2006 | Ware et al. | |
| 2006/0150055 A1 * | 7/2006 | Quinard et al. | 714/752 |
| 2007/0247935 A1 | 10/2007 | Ware et al. | |
| 2007/0255919 A1 | 11/2007 | Ware et al. | |
| 2008/0270643 A1 | 10/2008 | Tashiro | |
| 2008/0320265 A1 | 12/2008 | Yung et al. | |
| 2009/0138646 A1 | 5/2009 | Ware et al. | |
| 2009/0252102 A1 * | 10/2009 | Seidel et al. | 370/329 |
| 2012/0131901 A1 * | 5/2012 | Westervelt | F02C 9/266 60/204 |
| 2014/0341067 A1 * | 11/2014 | Zeira et al. | 370/252 |

OTHER PUBLICATIONS

International Preliminary Report on Patentability and Written Opinion dated Sep. 12, 2013 in International Application No. PCT/US2012/026583. 6 pages.

* cited by examiner

TIMING CALIBRATION FOR MULTIMODE I/O SYSTEMS

TECHNICAL FIELD

The present disclosure generally relates to techniques for calibrating data transmission channels and, more specifically, to calibrating data transmission channels during a transition from low data rate operations to high data rate operations.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Embodiments of the present disclosure include integrated circuit devices that transmit data over a channel between the devices in different modes. In a low data rate mode, data is transferred between integrated circuit devices at a low data signaling rate (e.g., 200 Mbps). In a high data rate mode, data is transferred between integrated circuit devices at a high data signaling rate (e.g., 3.2 Gbps). A transition mode facilitates the transition from the low data rate mode to the high data rate mode. During the transition mode, data is transferred between the integrated circuit devices at an intermediate data signaling rate (e.g. 800 Mbps) that is higher than the low data rate but lower than the high data rate, and parameters affecting the transmission of data between the integrated circuit devices are calibrated at the high data signaling rate. The data transfer and calibration operations are intermixed during the transition mode, which is beneficial for minimizing interruptions of the data transfers during the calibration process. The transition mode also beneficially ensures that the parameters are calibrated before data is transferred at a high data rate, thereby decreasing the risk of data transfer errors.

Reference will now be made to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
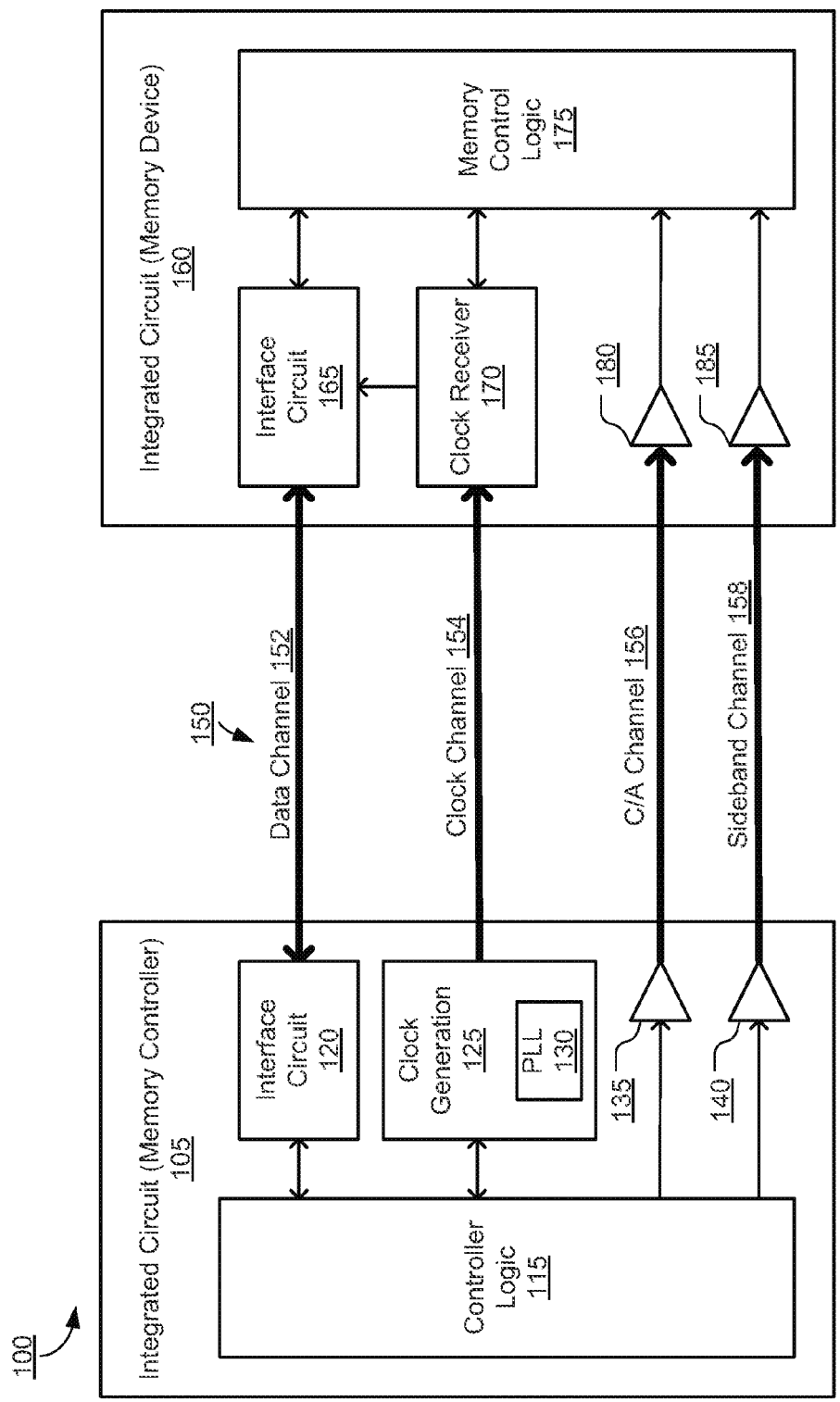
FIG. 1 illustrates one embodiment of a system that transmits data in different modes.

FIG. 1 illustrates one embodiment of a system 100 with integrated circuits that operate in different modes, according to one embodiment. The system 100 includes two integrated circuit (IC) devices. In one embodiment, the ICs 105 and 160 are a memory controller 105 and a memory device 160, respectively. Throughout this disclosure, reference will be made to a memory controller 105 and a memory device 160 as examples of integrated circuit devices. However, the principles described herein are applicable to any type of integrated circuit devices (e.g., Central Processing Unit, Graphics Processing Unit, Northbridge, Applications Processor, Baseband Processor, etc.) transmitting data between each other over a data channel. For simplicity of illustration, only one memory controller 105 and one memory device 160 are shown in FIG. 1. In other embodiments, a single memory controller 105 may be coupled to multiple memory devices 160.

Memory controller 105 and memory device 160 are coupled together via a communication channel 150. The communication channel 150 includes a bi-directional data channel 152, a clock channel 154, a command and address ("C/A") channel 156, and a sideband channel 158. Although shown as uni-directional links, in other embodiments, clock, C/A, and sideband channels may also be bi-directional links. Each channel may transfer single-ended signals carried on individual wires or differential signals carried on corresponding wire pairs. Each channel may also have multiple wires or pairs of wires to carry multiple bits of information in parallel. As used herein, "data rate" refers to the number of bits that can be transferred on a single wire (or pair of wires for differential signals) of the data channel 152 within a given time period.

Memory controller 105 includes an interface circuit 120 for transmitting and receiving data signals and calibration patterns via the data channel 152. Memory controller 105 also includes a clock generation circuit 125 that generates a clock signal for transmission across clock channel 154. In one embodiment, clock generation circuit 125 includes a phase locked loop (PLL) 130 that receives a reference clock (not shown) and outputs a clock signal that is higher in frequency (e.g., a frequency multiple) than the reference clock. For example, the reference clock may be a 100 MHz clock that is externally supplied to the memory controller 105. The PLL 130 receives the 100 MHz clock and generates a higher frequency clock, such as a 1.6 GHz clock. The PLL 130 may be disabled to reduce the power consumption of the memory controller 105. If the PLL 130 is disabled, the frequency of the clock generated by the clock generation circuit 125 is equal to the frequency of the reference clock.

In one embodiment, the interfaces 120 and 165 of integrated circuit devices use double data rate (DDR) signaling. In DDR signaling, both the rising and falling edges of the clock signal are used as timing references for sampling incoming data signals. Thus, a clock signal supports a data rate that is twice the frequency of the clock signal. For example, a 1.6 GHz clock signal corresponds to a data rate of 3.2 Gbps. In other embodiments, the interfaces 120 and 165 of system 100 use other types of signaling, such as single data rate (SDR) or quad data rate (QDR) signaling.

Memory controller 105 includes controller logic 115 for controlling the interface circuit 120 and clock generation circuit 125. Controller logic 110 also generates command/ address signals and sideband signals that are communicated to memory device 160 via interface circuits 135 and 140. The controller logic 115 further includes functionality for operating in different modes. During a low data rate mode, the controller logic 115 conserves power at the expense of performance by reducing the clock frequency and configuring the interface circuit 120 to transfer data across the data channel 152 at a low data rate, for example, a data rate of 200 Mbps. During a high data rate mode, the controller logic 115 maximizes performance at the expense of increasing power consumption by increasing the clock frequency and configuring the interface circuit 120 to transfer data across the data channel 152 at a high data rate, for example, a data rate of 3.2 Gbps. During a transition mode between the low data rate mode and the high data rate mode, the controller logic 115 configures the interface circuit 120 to transfer data across the data channel 152 at an intermediate data rate, for example, a data rate of 800 Mbps.

Memory device 104 represents any type of memory, for example, dynamic random access memory (DRAM), static random access memory (SRAM) or non-volatile memory. Memory device 160 includes an interface circuit 165 for transmitting and receiving data signals and calibration patterns to/from the memory controller 105 via the data channel 152. Memory device 160 includes a clock receiver 170 for receiving a clock signal from the memory controller 105 via clock channel 154. Memory device 160 also includes memory control logic 175 that receives command, address, and sideband signals from the memory controller 105 via interfaces 180 and 185. Memory control logic 175 decodes the received command, address, and sideband signals and configures the interface circuit 165 and clock receiver 170 according to the decoded signals. In one embodiment, the signals received from the memory controller 105 operate the memory device 160 in different modes, such as a low data rate mode, a transition mode, and a high data rate mode. The memory control logic 175 decodes these signals and configures the interface circuit 165 to transfer data with the memory controller 105 at the appropriate data rate.

Additionally, the illustrated system 100 is a clock forwarded architecture in which the memory controller 105 generates a clock signal that is used by the memory device 160 as a timing reference for sampling data signals, command signals, and/or sideband signals from the memory controller 105. The clock signal is also used as a timing reference by the memory controller 105 for transmitting and receiving data signals to/from the memory device 160. In other embodiments, a strobe signal is included in the data channel 152 and used as a timing reference to sample received data signals.

Both interface circuits 120 and 165 contain circuitry that is adjusted or tuned in accordance with calibration parameters. When transferring data signals at a high data rate across the data channel 152, even minor shifts in the voltage and temperature can negatively affect the integrity and timing of the data signals, resulting in unwanted data errors. The calibration parameters are intended to adjust the circuitry in the interface circuits 120 and 165 to account for various changes that would affect the integrity and timing of the data signals transmitted over channel 152, such as drifts in voltage and temperature. Maintaining properly tuned parameters becomes important at high data rates where there is little margin for changes in timing. However, having properly tuned parameters may be less important when transferring data at lower data rates due to the wide margin of error. The parameters can be stored in control registers (not shown) in the memory controller 105 and/or memory device 160 that are updated during a calibration operation. As used herein, references to "calibrating the data channel," "data channel is calibrated" or the like refers to calibrating these parameters affecting transmission of data between ICs 105, 160 over data channel 152. In one embodiment, "periodic timing calibration" refers to calibrating various parameters affecting data transfer via the data channel on a periodic basis to ensure that the parameters are properly tuned, for example, to account for drifts in voltage and temperature.

There are many different parameters that can be used to fine-tune the circuitry in the interface circuits 120 and 165. For example, such parameters include without limitation timing parameters such as receiver sample phase and transmitter drive phase, voltage parameters such as receiver offset or reference voltage, receiver current bias, receiver termination impedance, transmit supply voltage, transmit drive swing voltage, and transmit termination impedance.

In more detailed embodiments, the receiver sample phase is a parameter that affects the temporal position of a received signal relative to a timing reference (e.g., a clock signal) or other signal; transmitter drive phase is a parameter that affects the temporal position of a transmitted signal relative to a timing reference or other signal; receiver offset is a parameter that adjusts the voltage level of a received signal; receiver reference voltage is an offset that adjusts a receiver reference voltage; receiver current bias is a parameter that adjusts the bias voltage and a current source for a receiver circuit; receiver termination impedance is a parameter that affects the impedance of a transmission line termination for a receiver circuit; transmit supply voltage is a parameter that affects the supply voltage for a driver used to transmit a signal; transmit drive swing voltage is a parameter that affects the voltage swing of a transmitted signal by a transmitter; and transmit termination impedance is a parameter that affects the impedance of a transmission line termination on the transmitter (or driver) circuit used to transmit a signal or the impedance of the transmitter itself.

To calibrate the data channel 152 for write operations, the memory controller 105 may send timing calibration patterns to the memory device 160 via the data channel 152. The memory device 160 receives the pattern, samples it against the clock signal, and sends back a sampled result of this pattern. The memory controller 105 can then determine the proper parameter values based on the results received from the memory device 160. To calibrate the data channel 152 for read operations, the memory controller 105 causes the memory device 160 to transmit calibration patterns and the memory controller 105 then determines the proper parameter values based on the received patterns. As a result, calibration temporarily removes the data channel 152 from service, and no data can be transferred across the data channel 152 during this time when calibration is being performed.

Figure 2:
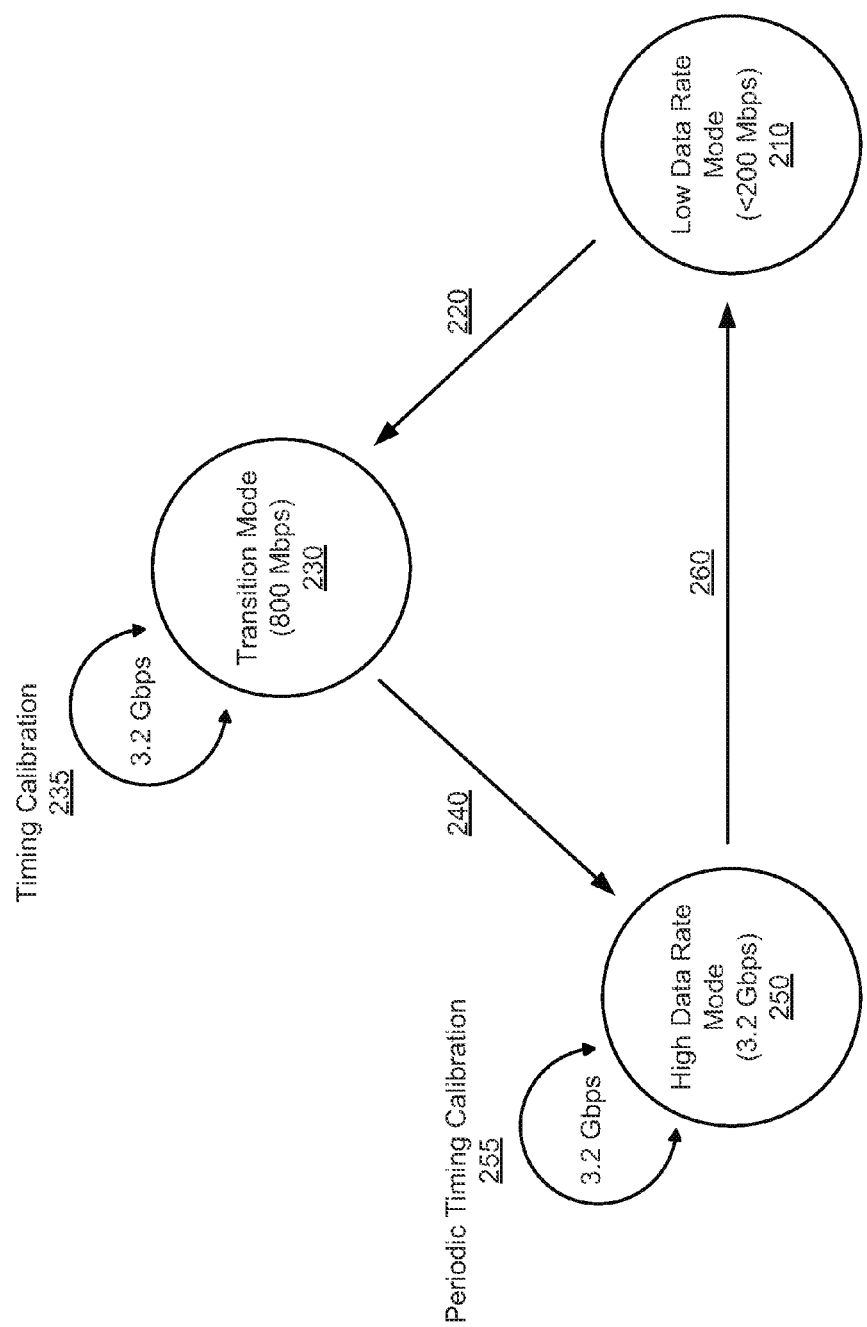
FIG. 2 illustrates one embodiment of a state diagram for transitioning from a low data rate mode to a high data rate mode.

FIG. 2 illustrates one embodiment of a state diagram of the system 100 for transitioning from a low data rate mode to a high data rate mode. FIG. 2 is explained together with FIG. 1. As shown, the memory controller 105 operates in three different modes, a low data rate mode 210, a transition mode 230, and a high data rate mode 250. Each mode supports a different data rate for transferring data between the memory controller 105 and the memory device 160. Operating in different modes allows the memory controller 105 to balance power consumption against performance. In the low data rate mode 210, the memory controller 105 sacrifices performance in the interests of reducing power consumption. In the high data rate mode, the memory controller 105 increases performance at the expense of increasing power consumption. The transition mode 230 allows the memory controller 105 to move between the low data rate mode 210 and the high data rate mode 250 with minimal interruption to data traffic, as will be explained below in greater detail. For instance, where the memory controller 105 and memory device 160 are used in a mobile device, high data rate mode 250 may be for normal operation of the mobile device, low data rate mode 210 may be for stand-by operation of the mobile device, and the transition mode 230 may be for when the mobile device resumes normal operation from stand-by operation.

During the low data rate mode 210, data is transferred across the data channel 152 at a low data rate, for example, 200 Mbps. To reduce power consumption, the PLL 130 in the memory controller 105 may be turned off. Without the PLL 130, the clock generation circuit 125 generates a clock signal with a frequency that is equal to a frequency of a reference clock. As a result, the data rate of the data channel 152 is limited by the frequency of the reference clock. For example, if the reference clock is 100 MHz, the data rate of the data channel 152 is limited to 200 Mbps when using DDR signaling. To further reduce power consumption, the data channel 152 is not calibrated during the low data rate mode 210 because calibration is not necessary at low data rates. In other embodiments, the low data rate mode 210 is a startup mode where no data is being transferred.

If the memory controller 105 needs more bandwidth than is supported by the data rate of the low data rate mode 210, the memory controller 105 initiates a transition into a high data rate mode 250. However, transitioning directly from a low data rate mode 210 to a high data rate mode 250 is not ideal. Because the data channel 152 is not calibrated during the low data rate mode 210, the calibration parameters are out-dated and may not be properly tuned to account for any recent shifts in voltage and temperature. Calibration is not needed to avoid errors at low data rates where there is a large margin for error, but a properly calibrated data channel 152 is important in avoiding errors at high data rates. An alternative approach is to calibrate the data channel 152 in a single block of time before entering the high data rate mode 250. However, calibrating in this manner is also not ideal. Calibration consumes a non-trivial amount of time (e.g., between 10-200 µs), during which data transfers are completely blocked. For applications with low-latency requirements, such as music and video players, this can cause skipping and stuttering. Thus, according to embodiments herein, the system 100 first enters 220 an intermediate transition mode 230 prior to entering high data rate mode 250 in order to make the transition into high data rate mode 250 with a fully calibrated data channel 152 without interrupting data transfers.

During the transition mode 230, the memory controller 105 and memory device 160 transfer data across the data channel 152 at an intermediate data rate that is higher than the data rate of the low data rate mode 210, but still lower than the data rate of the high data rate mode 250. For example, if the data rate during the low data rate mode 210 is 200 Mbps and the data rate during the high data rate mode 250 is 3.2 Gbps, the data rate during the transition mode 230 may be 800 Mbps. Transferring data at an intermediate data rate enables the memory controller 105 to better meet the higher data rate requirements that instigated the transition away from the low data rate mode 210. Further, the intermediate data rate is still low enough to support data transfer without errors even if the calibration parameters are not completely optimized.

During the transition mode 230, the data channel 152 is also calibrated at the high data rate of the high data rate mode 250. For example, during the transition mode 230, data may be transferred across the data channel 152 at an intermediate data rate of 800 Mbps, while the data channel 152 is also calibrated at a higher data rate of 3.2 Gbps by transmitting and receiving calibration patterns that are sampled against a 1.6 GHz clock. Calibrating the data bus at the high data rate enables the memory controller 105 to transition 240 into the high data rate mode 250 without the risk of encountering data errors. Because calibration does temporarily block data traffic for a non-trivial amount of time, the calibration operations are divided into smaller steps and mixed with the transfers of data in the transition mode 230 according to the embodiment herein. Mixing calibration and data transfer in this manner minimizes the interruption of data traffic, which is beneficial for applications that require low-latency memory access. The relationship between data transfer at an intermediate data rate and calibration at a high data rate is described in further detail in conjunction with FIG. 3.

In one embodiment, the intermediate data rate is accomplished through bit stuffing. In bit stuffing, the PLL 130 in the clock generation circuit 125 generates a clock signal that operates at a frequency corresponding to a high data rate. However, when data is actually transferred across the data channel 152, redundant data bits are inserted into the stream of data to lower the effective data rate. For example, the data stream "1010" would appear as "111000111000" on the data channel 152 after two bit stuffing. The effective data rate can be adjusted by increasing or decreasing the number of stuffed bits. For example, if the clock is a 1.6 GHz signal corresponding to a data rate of 3.2 Gbps, a data signal stuffed with two bits has an effective data rate of 1.066 Gbps. A data signal stuffed with three bits has an effective data rate of 800 Mbps. Bit stuffing is further explained in conjunction with FIG. 4.

In another embodiment, the intermediate data rate is accomplished with a clock divider circuit. Here, the PLL 130 also generates a clock signal that operates at a frequency that corresponds to a high data rate. The frequency of the PLL clock 130 is then reduced with a clock divider (not shown) in the clock generation circuit 125. For example, the PLL may output a 1.6 GHz clock that corresponds to a high data rate of 3.2 Gbps when using DDR signaling. By using a clock divider, the frequency of the PLL clock is reduced to a 400 MHz, which corresponds to an intermediate data rate of 800 Mbps. Data is transmitted at this intermediate data rate of 800 Mbps using the reduced clock signal in the transition mode 230, according to this alternative embodiment.

Once the memory controller 105 determines that the data channel 152 is calibrated, the memory controller 105 initiates a transition 240 into a high data rate mode 250. During the high data rate mode 250, the memory controller 105 and memory device 160 transfer data across the data channel 152 at a high data rate, such as 3.2 Gbps. The memory controller 105 also periodically calibrates 255 the data channel 152 at the high data rate to account for shifts in voltage and temperature. Once the memory controller 105 no longer requires the high data rate supported by the high data rate mode 250, the memory controller 105 may transition 260 back to low data rate mode 210.

Figure 3:
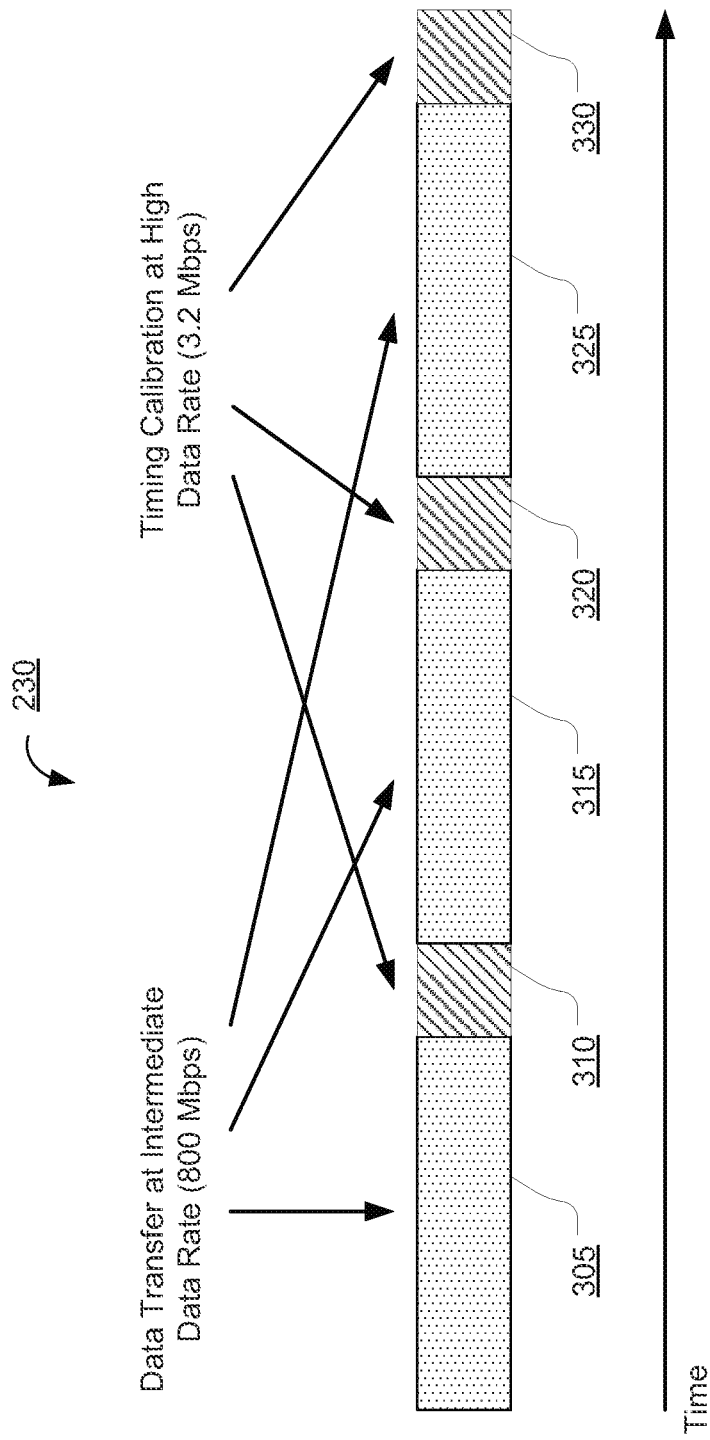
FIG. 3 illustrates one embodiment of intermixed data transfer and timing calibration during the transition mode.

FIG. 3 illustrates one embodiment of intermixed data transfer and timing calibration during the transition mode 230. As shown, during time periods 305, 315, and 325, data is transferred at an intermediate data rate (e.g., 800 Mbps) across the data channel 152. As explained above, the intermediate data rate can be achieved by bit stuffing with a clock signal operating at a frequency corresponding to a high data rate in one embodiment, or by use of a clock signal with its frequency itself reduced to the intermediate data rate according to an alternative embodiment. During time periods 310, 320 and 330, the data channel 152 is calibrated at a high data rate (e.g., 3.2 Gbps) by transferring calibration patterns across the data channel 152 at the high data rate. The time periods for data transfer (e.g., 305, 315, 325) are distinct from (i.e., non-overlapping with) and intermixed with the time periods for calibration (e.g., 310, 320, 330). Although shown to have similar time duration, time periods 305, 315, and 325 may or may not be of similar time duration. Similarly, time periods 310, 320, and 330 may or may not be of similar time duration. This repeating and alternating cycle of data transfer followed by timing calibration continues until the calibration is complete, upon which the memory controller 105 transitions into a high data rate mode 250.

To minimize interruptions of data traffic, the timing calibration procedure is divided into several smaller steps. Performing the entire timing calibration at one time may take between 10-200 μs, resulting in a latency that is unacceptable for certain applications. Dividing calibration into smaller steps that are intermixed with periods of data transfer helps to mitigate this latency penalty. In one embodiment, calibration can be divided into steps by parameter. For example, the parameter for transmitter drive phase may be calibrated during one time period 310. The parameter for receiver sample phase is then calibrated during the next time period 320. In another embodiment, calibration can be further divided into smaller steps. For example, the transmitter drive phase parameter may be incrementally adjusted in sequential time periods 310, 320, and 330 until the optimal value for the parameter is identified.

Figure 4:
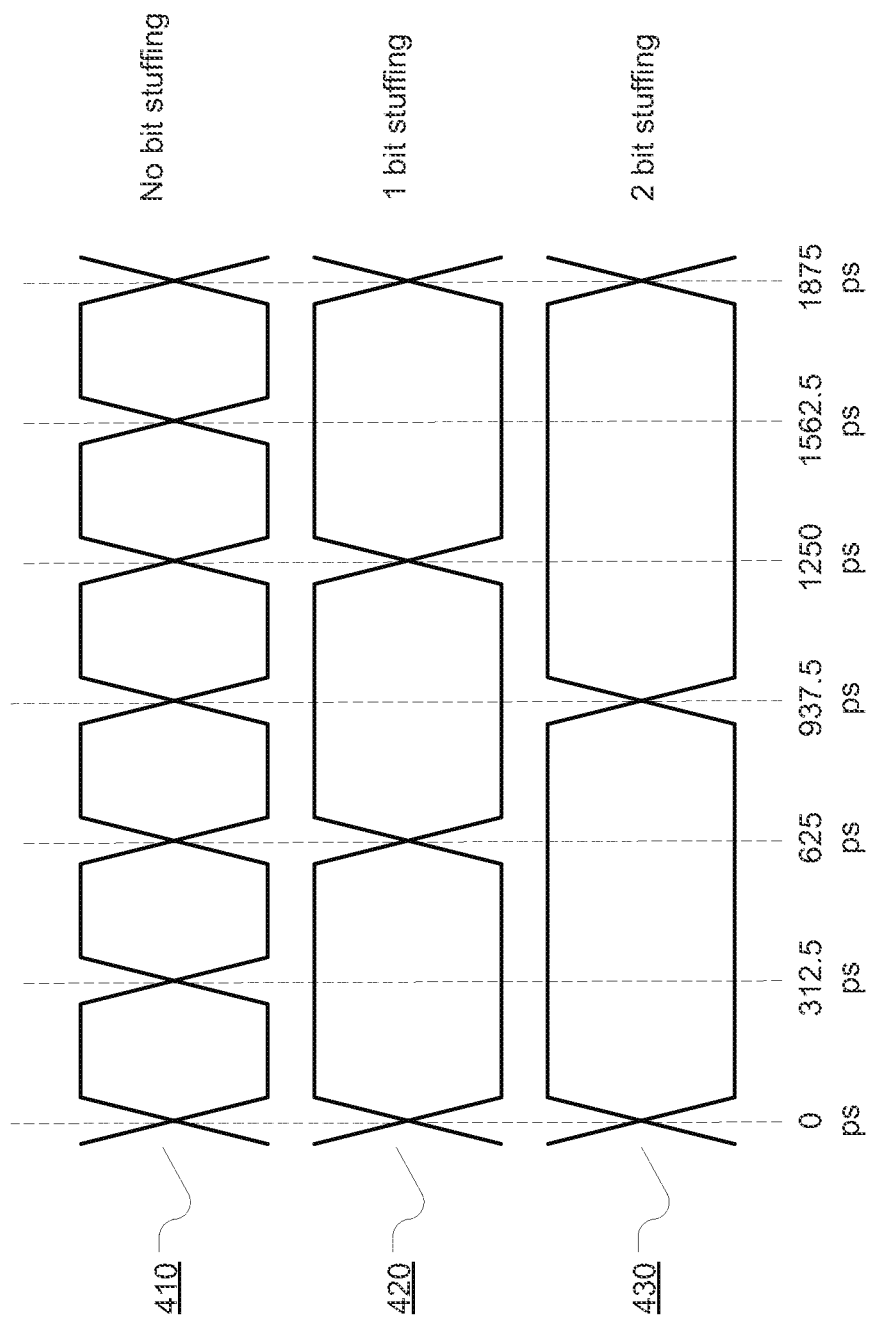
FIG. 4 illustrates one embodiment of different data eyes for different levels of bit stuffing.

FIG. 4 illustrates one embodiment of different data eyes for different levels of bit stuffing. As previously explained, bit-stuffing may be used during the transition mode 230 to reduce the effective data rate of the data transfers. During bit-stuffing, the device transmitting data (e.g., memory controller 105 or memory device 160) adds extra redundant bits to the data to be transferred. For example, a bit sequence of 1010 becomes 111000111000 after two bit stuffing. Bit stuffing thus reduces the effective data rate of the data without changing the frequency of the clock. The device receiving the bit stuffed data (e.g., memory controller 105 or memory device 160) is also configured to sample the bit stuffed data at the proper times. For example, if two bit stuffing is being used, the receiving device would sample the data at every third clock cycle. If one bit stuffing is being used, the receiving device would sample the data between every other clock cycle. Alternatively, the receiver can sample all the bits and ignored stuffed bits.

As shown as an example in FIG. 4, waveform 410 represents the data eye for a data signal with no bit stuffing. The data eye for the data signal is only 312.5 ps wide and corresponds to a data rate of 3.2 Gbps. This data eye is very narrow and provides little margin for error for sampling of the data. Waveform 420 represents the data eye for a data signal with one bit stuffing. The data eye is 625 ps wide and corresponds to an effective data rate of 1.6 Gbps. Because the data eye is twice as wide as the data eye in waveform 420, the margin of error is increased. Waveform 430 represents the data eye for a data signal with two bit stuffing. The data eye is 937.5 ps wide and corresponds to an effective data rate of 1.067 Gbps. This data eye is three times as wide as the data eye in waveform 420. Bit stuffing thus increases the size of the data eye and reduces the likelihood of data errors when transmitting data via a data channel 152 that is not properly calibrated during the transition mode 230.

Figure 5:
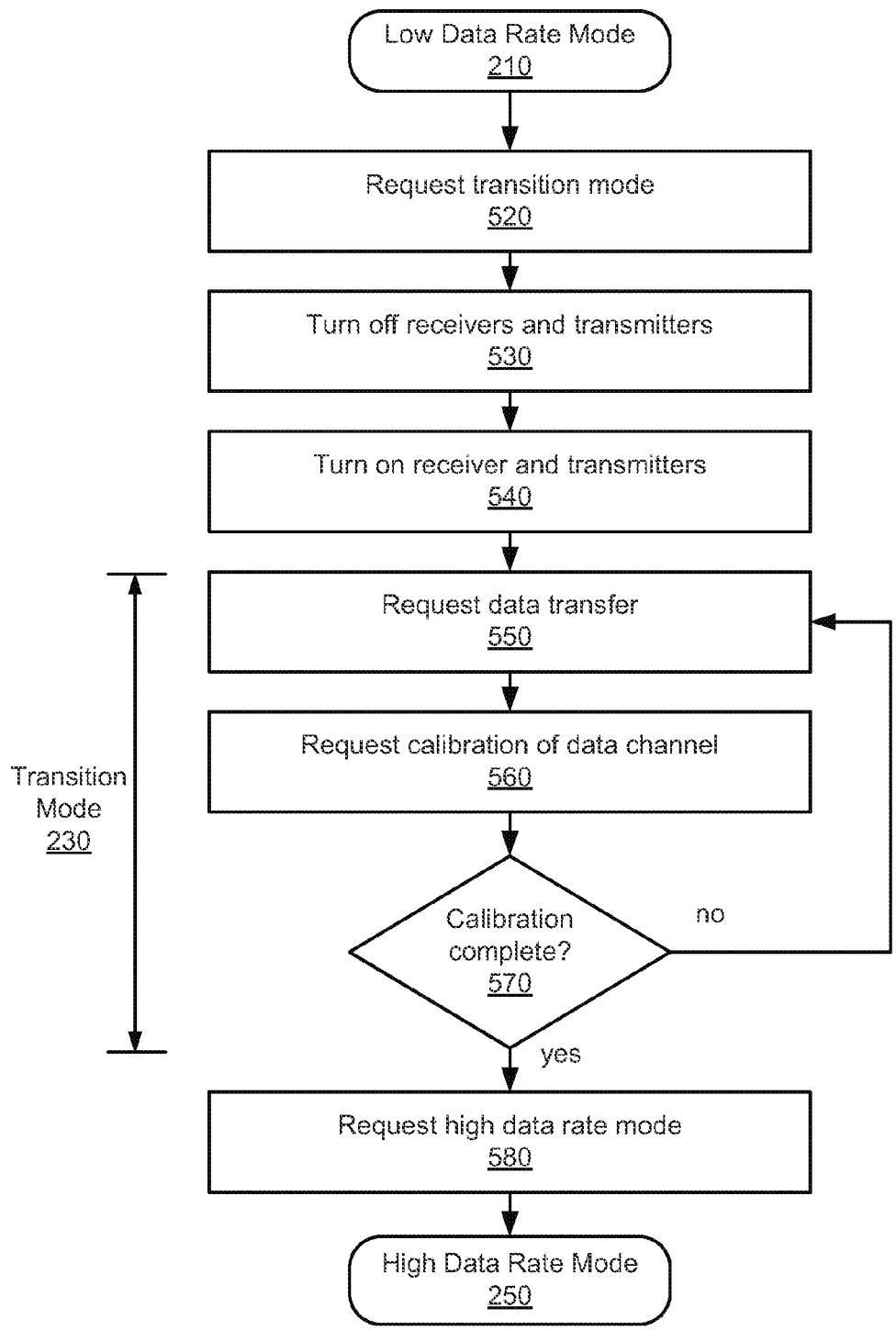
FIG. 5 illustrates one embodiment of a method performed by a memory controller during a transition mode.

FIG. 5 illustrates one embodiment of a method performed by a memory controller during a transition mode 230. FIG. 5 is explained also in conjunction with FIGS. 1 and 2. Initially it is assumed that the memory controller 105 is operating in a low data rate mode 210 and the PLL 130 in the memory controller 105 is not active to reduce power consumption. Because the PLL 130 is not active, the low data rate mode 210 only supports data transfer at a low data rate. Alternatively, the low data rate mode may be a power down mode in which no data transfer is supported at all.

When a higher data rate is needed, the memory controller 105 sends a request 520 for the memory device 160 to operate in a transition mode 230. In one embodiment, the request is sent as one or more command signals over the C/A channel 156, which is then received and decoded by the memory device 160.

The memory controller 105 next turns 530 off the transmitters and receivers in the interface circuit 165 of the memory device 160 by de-asserting a power management signal (not shown). In one embodiment, the power management signal is transmitted from memory controller 105 to memory device 160 via the sideband channel 158. To turn off 530 the transmitters and receivers of the memory device 160, the memory controller 105 de-asserts the power management signal via the sideband channel 158. Upon receiving the de-asserted power management signal, the memory device 160 turns off the transmitters and receivers in the interface circuit 165. Once the transmitters and receivers are off, the memory controller 105 also turns on its PLL 130 to generate a high frequency clock signal that is output onto the clock channel 154.

When the PLL 130 stabilizes, the memory controller 105 turns on 540 the receivers and transmitters in the interface circuit 165 of the memory device 160 by re-asserting the power management signal. The memory device 160 responds by turning on the transmitters and receivers in its interface circuit 165.

The memory controller 105 subsequently requests 550 data transfer with the memory device 160 at an intermediate data rate. For example, the data transfer can include writing data to the memory device 560 or reading data from the memory device 560. In one embodiment, the data transfer request is sent through one or more sideband signals via the sideband channel 158. The memory device 160 receives the intermediate data rate data transfer request, after which the data transfer occurs at an intermediate data rate across the data channel 152 in the transition mode 230. In one embodiment, when the intermediate data rate is accomplished through bit-stuffing, the sideband request indicates to the memory device 160 to transfer bit-stuffed data. Alternatively, the memory device 160 may be configured to transfer bit-stuffed data as a result of the request in step 520.

Next, the memory controller 105 requests 560 calibration of the data channel 152 at the high data rate of the high data rate mode 250. In one embodiment, the calibration request is sent through one or more sideband signals over the sideband channel 158. The memory device 160 receives the calibration request, after which the calibration of the data channel 152 is performed at the high data rate.

The process of requesting 550 data transfer and requesting 560 calibration continues until the data channel 152 is fully calibrated. In other embodiments, the order of step 550 and 560 may be different. For example, steps 550 and 560 may be reversed so that calibration is requested 560 before data transfer is requested 550. As another example, a request 560 for calibration may be both the first and last requests sent during the transition mode 230. Once the memory controller 105 determines that calibration is complete 570, the memory controller 105 requests 580 the memory device 160 to operate in a high data rate mode 250. In one embodiment, the request is sent as command signals over the C/A channel 156, which is then received and decoded by the memory device 160. Once in the high data rate mode 250, the memory controller 105 transfers data with the memory device 160 at a high data rate, while also periodically calibrating the data channel 152 at the high data rate.

The various operations in FIG. 5 have been described with specific embodiments that transmit signals via the C/A channel 156 or the sideband channel 158. In other embodiments, the signals for carrying out the operations of FIG. 5 may be transmitted on any of the C/A channel 156, sideband channel 158, and/or as in-band signals of the data channel 152.

As described in the present disclosure, the integrated circuit devices 105 and 160 in the system 100 are capable of operating in different modes with different data rates. In a low data rate mode, data is transferred between the integrated circuit devices 105 and 160 at a low data rate. In a high data rate mode, data is transferred between integrated circuit devices 105 and 160 at a high data rate. In a transition mode between the low data rate mode and high data rate mode, data is transferred between the integrated circuit devices 105 and 160 at an intermediate data rate while the data channel 152 is calibrated at a high data rate. Transitioning from a low data rate mode to a high data rate mode in this manner thus allows for calibration of the data channel 152 while minimizing the interruption of any data transfers.

Upon reading this disclosure, those of ordinary skill in the art will appreciate still alternative structural and functional designs for transitioning from a low data rate mode of operations to a high data rate mode of operations through the disclosed principles of the present disclosure. For example, the disclosed embodiments are applicable to multi-mode devices that support any number of data rates. The disclosed embodiments are also applicable to any integrated circuit devices that may communicate over either serial or parallel data channels. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the spirit and scope of the disclosure as defined in the appended claims.

What is claimed is:

1. A method for operating an integrated circuit device that supports at least a first data transmission mode and a second data transmission mode, the method comprising
   during the first data transmission mode, transmitting data at a first data rate;
   during a transition mode for transitioning from the first data transmission mode to the second data transmission mode:
      transmitting data at a second data rate that is higher than the first data rate during a first plurality of time periods of the transition mode; and
      calibrating one or more parameters affecting transfer of data, the one or more parameters calibrated at a third data rate that is higher than the second data rate and calibrated during a second plurality of time periods of the transition mode distinct from and inter-mixed with the first plurality of time periods; and
   during the second data transmission mode, transmitting data at the third data rate.

2. The method of claim 1, wherein transmitting data at a second data rate comprises adding one or more redundant data bits with values equal to values of data bits to be transmitted.

3. The method of claim 2, further comprising transmitting a clock signal that operates at a common frequency during the first plurality of time periods and the second plurality of time periods.

4. The method of claim 2, further comprising receiving a clock signal that operates at a common frequency during the first plurality of time periods and the second plurality of time periods.

5. The method of claim 1, further comprising, transmitting a clock signal that operates at a first frequency corresponding to the second data rate during the first plurality of time periods and that operates at a second frequency corresponding to the third data rate during the second plurality of time periods.

6. The method of claim 1, further comprising receiving a clock signal that operates at a first frequency corresponding to the second data rate during the first plurality of time periods and that operates at a second frequency corresponding to the third data rate during the second plurality of time periods.

7. The method of claim 1, wherein the first plurality of time periods alternate with the second plurality of time periods.

8. The method of claim 1, wherein data is transmitted at the third data rate responsive to determining that the one or more parameters are calibrated.

9. The method of claim 1, wherein the one or more parameters are calibrated at the third data rate during the second plurality of time periods of the transition mode by transmitting or receiving calibration patterns at the third data rate.

10. The method of claim 1, wherein calibrating the one or more parameters affecting transfer of data comprises:
    transmitting a calibration pattern to another device at the third data rate;
    receiving a sampled version of the calibration pattern from the another device; and
    determining one or more values for the one or more parameters based on the sampled version of the calibration pattern.

11. The method of claim 1, wherein calibrating the one or more parameters affecting transfer of data during the second plurality of time periods comprises calibrating one or more of: receiver drive phase, transmitter drive phase, receiver voltage offset, receiver reference voltage offset, receiver current bias, receiver termination impedance, transmit supply voltage, transmit swing voltage or transmit termination impedance.

12. The method of claim 1, wherein the data is transmitted across a data communication channel during the first plurality of time periods, and data is prevented from being transmitted across the data communication channel during the second plurality of time periods during which the parameters are calibrated.

13. An integrated circuit device that supports at least a first data transmission mode and a second data transmission mode, the device comprising:
    an interface circuit; and
    a control circuit coupled to the interface circuit, the control circuit including logic to configure the interface circuit to:
      during the first data transmission mode, transmit data at a first data rate;
      during a transition mode for transitioning from the first data transmission mode to the second data transmission mode:
         transmit data with the second integrated circuit at a second data rate that is higher than the first data rate during a first plurality of time periods of the transition mode;
         transmit calibration patterns corresponding to parameter calibration, the calibration patterns transmitted at a third data rate that is higher than the second data rate and transmitted during a second plurality of time periods of the transition mode distinct from and inter-mixed with the first plurality of time periods; and
      during the second data transmission mode, transmit the data at the third data rate.

14. The integrated circuit device of claim 11, wherein the control circuit adds one or more redundant data bits with values equal to values of data bits to be transmitted at the second data rate.

15. The integrated circuit device of claim 14, further comprising a clock generation circuit for transmitting a clock signal, the clock signal operating at a common frequency during the first plurality of time periods and the second plurality of time periods.

16. The integrated circuit device of claim 14, further comprising a clock receiver circuit for receiving a clock signal, the clock signal operating at a common frequency during the first plurality of time periods and the second plurality of time periods.

17. The integrated circuit device of claim 13, further comprising a clock generation circuit for transmitting a clock signal, the clock signal operating at a first frequency corresponding to the second data rate during the first plurality of time periods and operating at a second frequency corresponding to the third data rate during the second plurality of time periods.

18. The integrated circuit device of claim 13, further comprising a clock receiver circuit for receiving a clock signal, the clock signal operating at a first frequency corresponding to the second data rate during the first plurality of time periods a first plurality of time periods alternate with the second plurality of time periods.

19. The integrated circuit device of claim 13, wherein the first plurality of time periods alternate with the second plurality of time periods.

20. The integrated circuit device of claim 13, wherein the calibration patterns are used to calibrate one or more parameters affecting transfer of data and the control circuit configures the interface circuit to transmit the data at the third data rate responsive to determining that the one or more parameters are calibrated.

* * * * *